(12) United States Patent
Massonnat et al.

(10) Patent No.: US 9,589,081 B2
(45) Date of Patent: Mar. 7, 2017

(54) KARSTIFICATION SIMULATION

(75) Inventors: Gérard Massonnat, Pau (FR); Francis Morandini, Pau (FR)

(73) Assignee: TOTAL SA, Courbevoie (FR)

( * ) Notice: Subject to any disclaimer, the term of this patent is extended or adjusted under 35 U.S.C. 154(b) by 582 days.

(21) Appl. No.: 13/876,417

(22) PCT Filed: Sep. 14, 2011

(86) PCT No.: PCT/FR2011/052099
§ 371 (c)(1),
(2), (4) Date: Mar. 27, 2013

(87) PCT Pub. No.: WO2012/045936
PCT Pub. Date: Apr. 12, 2012

(65) Prior Publication Data
US 2013/0185043 A1  Jul. 18, 2013

(30) Foreign Application Priority Data
Sep. 27, 2010 (FR) ..................... 10 57750

(51) Int. Cl.
*G06G 7/48* (2006.01)
*G06F 17/50* (2006.01)
*G01V 99/00* (2009.01)
*G01V 11/00* (2006.01)

(52) U.S. Cl.
CPC .......... *G06F 17/5009* (2013.01); *G01V 11/00* (2013.01); *G01V 99/00* (2013.01); *G01V 2210/661* (2013.01)

(58) Field of Classification Search
CPC .... G06F 17/5009; G01V 11/00; G01V 99/00; G01V 2210/661

(Continued)

(56) References Cited

U.S. PATENT DOCUMENTS

2002/0120429 A1* 8/2002 Ortoleva ........................ 703/2
2005/0234690 A1* 10/2005 Mainguy et al. ............. 703/10

(Continued)

OTHER PUBLICATIONS

Jerome Guilbot, Valary G. Khaidukov, Eugene Landa, Galina V. Reshetova, Vladimir A. Tcheverda, "Finite-difference simulation of elastic waves propagation in multiscale media on the base of local grid refinement" SEG Las Vegas 2008 Annual Meeting, pp. 2062-2066.*

(Continued)

*Primary Examiner* — Dwin M Craig
(74) *Attorney, Agent, or Firm* — Patterson Thuente Pedersen, P.A.

(57) ABSTRACT

The invention relates to a method for simulating karstification phenomena in a karstic region, comprising a) defining a gridded geological model of the karstic region, in order to model a plurality of environments including a first environment described by values of at least one geological grid parameter, and a second environment described by values of edge parameters between two grid nodes, b) simulating stochastic displacements of particles in the grid of the geological model, the probability of each displacement of a particle being calculated taking into account values describing the environment within which the displacement is carried out, and c) modifying the values describing the first and/or second environment according to the courses taken by the particles.

10 Claims, 4 Drawing Sheets

(58) Field of Classification Search
USPC .......................................................... 703/6
See application file for complete search history.

(56) References Cited

U.S. PATENT DOCUMENTS

2006/0184347 A1* 8/2006 Noetinger et al. .............. 703/10
2006/0241925 A1* 10/2006 Schaaf et al. ................... 703/10
2008/0243454 A1* 10/2008 Mallet ..................... G01V 11/00
                                                                703/6

OTHER PUBLICATIONS

O. Jaquet, P. Siegal, G. Klubertanz, H. Benabdeerhamane, "Stochastic discrete model of karstic networks" Advances in water resources 27 (2004) pp. 751-760.*

Jacquet, O., "Stochastic discrete model of karstic networks", Advances in Water resources, vol. 27, No. 7, Jul. 1, 2004, pp. 751-760.

Pappadopolou et al., "Terrain Discontinuity Effects in the Regional Flow of a Comple Karstified Aquifer", Environmental Modeling & Assessment, Kluwer Academic Publishers, vol. 15, No. 5, Oct. 27, 2009, pp. 319-328.

Anwar, et al., "Lattice Boltzmann simulation of solute transport in heterogenous porous media with conduits to estimate macroscopic continuous time random walk model parameters", Progress in Computational Fluid Dynamics, an International Journal, vol. 8, No. 1/2/3/4, Mar. 31, 2008, pp. 213-221.

Perea-Reeves, "A lattice-gas study of dispersion in alveolated channels", Chemical Engineering Science, vol. 52, No. 19, Oct. 1, 1997, pp. 3277-3286.

* cited by examiner

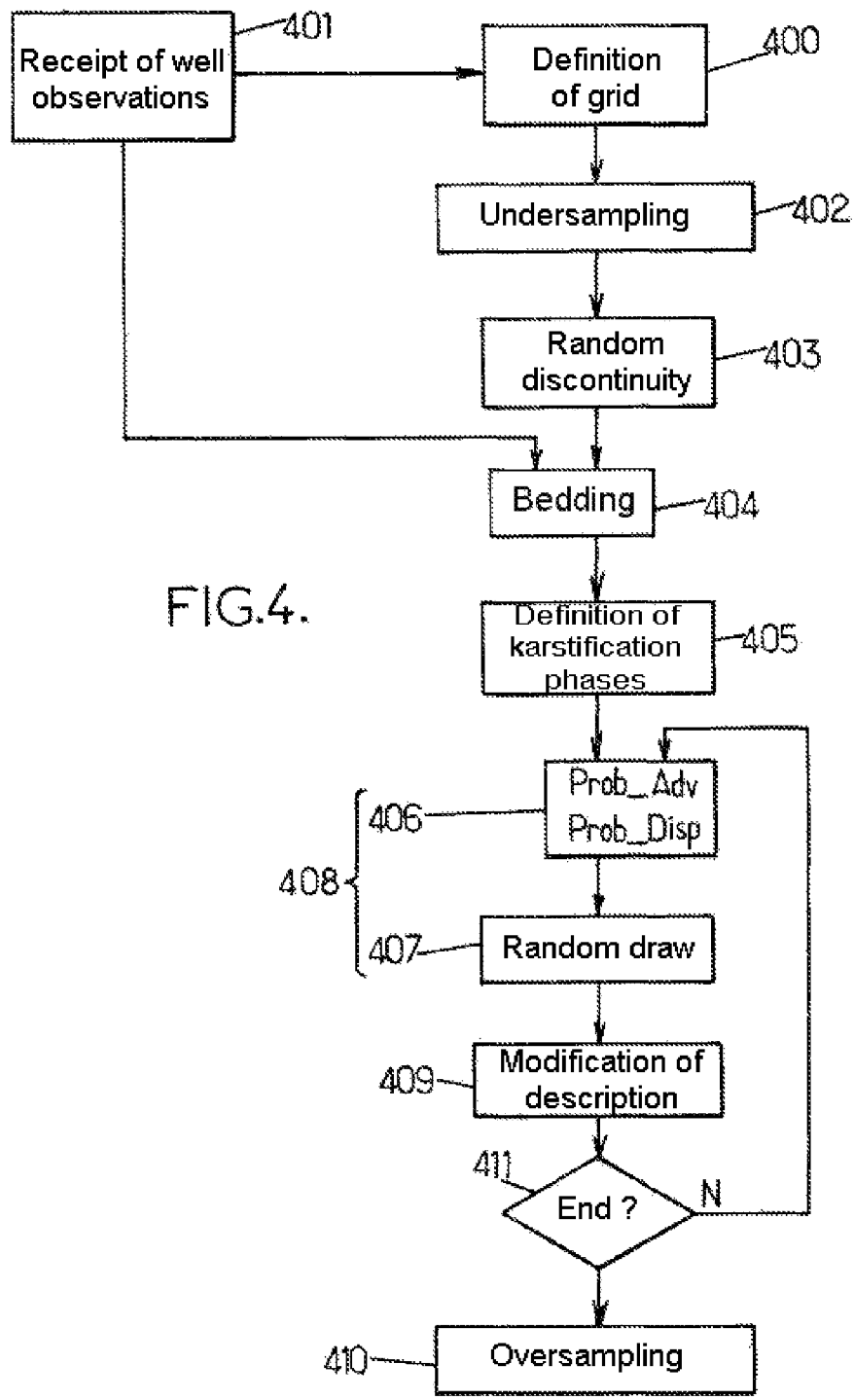

KARSTIFICATION SIMULATION

RELATED APPLICATIONS

The present application is a National Phase entry of PCT Application No. PCT/FR2011/052099, filed Sep. 14, 2011, which claims priority from FR Application No. 10 57750 filed Sep. 27, 2010, both of which are hereby incorporated by reference herein in their entirety.

FIELD OF THE INVENTION

The invention relates to the field of the simulation of geological processes for studying the subsoil and particularly is focused on the karstification phenomena in a karstic region.

BACKGROUND OF THE INVENTION

Karstification of a rock is the phenomenon whereby this rock is fashioned by the dissolution of carbonates in water. The water infiltrates through interstices of the rock, for example pores or fractures, and this infiltration increases the size of these interstices by virtue of the dissolution of carbonates of the rock in the infiltrated water. Fractures and cavities can thus be formed.

The water may typically be rainwater made acid by carbon dioxide from the atmosphere or the ground. The water may, among other things, originate for example from hydrothermal lifts.

The rock may, for example, comprise limestone.
It is known practice to model a karstic region statically, by using observations, in particular geological and seismic observations. When drilling a well, data measured via the well, called well data, can be used to make a posteriori adjustments to the model of the karstic region. However, this traditional approach is limited in that it does not dynamically reproduce the geological and hydrological processes leading to the formation of the karst, and in that the adjustment of the model to the well data can be relatively complex and sometimes unstable.

The article by O. Jaquet et al., "Stochastic discrete model of karstic networks", Advances in Water Resources 27 (2004), 751-760, describes a method for simulating karstification phenomena based on a stochastic approach. A karstic region is modeled as a network of pipes corresponding to fractures that are more or less wide depending on the diameter of the pipe. Particles corresponding to water droplets are introduced, and their displacement over the network is subjected to laws of "random walk" type.

There is a need to improve the quality of the simulation.

SUMMARY OF THE INVENTION

According to a first aspect, the subject of the invention is a method for simulating karstification phenomena in a karstic region, comprising the following steps:

a) defining a gridded geological model of the karstic region in order to model a plurality of environments comprising a first environment described by values of at least one geological grid parameter, and a second environment described by values of edge parameters between two nodes of the grid, b) simulating stochastic displacements of particles in the grid of the geological model, the probability of each displacement of a particle being calculated by taking into account the values describing the environment in which the displacement is carried out, and c) modifying the values describing the first and/or the second environment according to the courses taken by the particles.

The particles can correspond to water infiltrating the interstices of the rock.

With such a gas-over-network approach, the type of geological model adopted partly determines the quality of the simulation.

The geological model represents at least two environments, one corresponding to a flow of water in the very rock via pores, and the other corresponding to a flow of water through discontinuities that can be modeled by pipes for example. The geological model incorporates both the hydraulic and geological stresses, so that the simulation relies on a modeling that is of better quality and more realistic than in the prior art.

Furthermore, this simulation can take into account, in the step c), the fact that the infiltration of water increases the size of the interstices.

Obviously, a third environment or more can be provided, described by other parameters.

Advantageously, in the step b), a pre-established hydraulic gradient that is a function of the region in which the displacement is carried out is also taken into account. For example, if the displacement considered takes place in a region of hydrothermal lifts, the hydraulic gradient can be directed toward the sky.

The invention is in no way limited by the fact that the hydraulic gradient is taken into account.

Advantageously, in the step b), for at least one displacement in the first environment, an equivalent parameter value is estimated from the values of geological parameters of the grids comprising an edge corresponding to this displacement, for example by averaging these values.

Thus, it is possible to switch from a volume-oriented description of the first environment to a characterization of the displacements considered.

The invention is obviously not limited to this feature. It is possible, for example, to provide for choosing an equivalent parameter equal to a geological parameter of one of the grids comprising an edge corresponding to this displacement.

Advantageously, in the step b), for at least one displacement in the second environment, an equivalent parameter value is estimated from the edge parameter value corresponding to this displacement.

This equivalent parameter value can make it possible to evaluate a displacement probability.

Thus, although the descriptions of the first and of the second environments are relatively different, the probabilities of displacement in the first and second environments can obey relatively similar laws, in as much as these probabilities in both cases depend on equivalent parameters.

Obviously, the invention is not limited by an estimation of equivalent parameter values. Provision can be made for the probabilities of displacement in the first and in the second environments to obey relatively different laws.

Provision can be made for the simulated displacements to be advective and/or dispersive, even though the invention is obviously not limited by the type of the displacements envisaged.

Provision can also be made to offer the possibility, in the step b), of taking into account the values describing only one of the first and second environments, which makes it possible to better quantify the sensitivity to the initial conditions (for example, a number of fractures introduced).

In particular, it can be proposed to a user that only the values describing the first environment be taken into account during the simulation.

The invention is obviously not limited to this option. Advantageously, observations of the karstic region are carried out, and these observations are used, in particular to define, in the step a), the gridded geological model of the karstic region.

For example, core samples are taken at various places in the karstic region. These core samples make it possible to provide information on the actual karstic region, in particular the rough placements of the various layers forming the karstic region, and for each layer, the faces of the layer. Such information can be used to define the gridded geological model. Thus, the starting point is a geological model that is relatively close to the real karstic region, which makes it possible to increase the reliability of the simulation results.

Obviously, the invention is not limited by these observations of the karstic region. It is possible, for example, to apply the method according to one aspect of the invention for the purposes of studying karstification phenomena, by starting from deliberately fictitious geological models.

Advantageously, the first environment is described by grid permeability values. Permeability is in fact a parameter involved in the displacement of the water particles in the rock.

The first environment can be described by other parameters, such as, for example, the porosity.

The invention is not limited to the grids forming a grid of sugar box type. More complex grid geometries can, for example, be provided.

According to another aspect, the subject of the invention is a computer program product for simulating karstification phenomena in a karstic region, the computer program being intended to be stored in a memory of a central processing unit, and/or stored on a memory medium intended to cooperate with a drive of the central processing unit and/or downloaded via a telecommunication network, characterized in that it comprises instructions for executing the steps of the method explained above.

According to yet another aspect, the subject of the invention is a device for simulating karstification phenomena in a karstic region. This device comprises a memory for storing a gridded geological model of the karstic region, the model comprising a description of a first environment described by values of at least one geological grid parameter, and of a second environment described by values of edge parameters between two nodes of the grid. Processing means, for example a processor, make it possible to simulate stochastic displacements of particles in the grid of the geological model, the probability of each displacement of a particle being calculated by taking into account the description of the environment in which the displacement is carried out. The processing means also make it possible to modify the values of the descriptions according to the courses taken by the particles.

This device can, for example, comprise a computer, a central processing unit of a computer, a processor, or even a computer dedicated to simulating karstification phenomena.

Other features and advantages of the present invention will become apparent from the following description.

BRIEF DESCRIPTION OF THE FIGURES

FIG. 4 is a simple flow diagram of a method that can be executed by a simulation device according to an embodiment of the invention.

DESCRIPTION OF EMBODIMENTS

Figure 1:
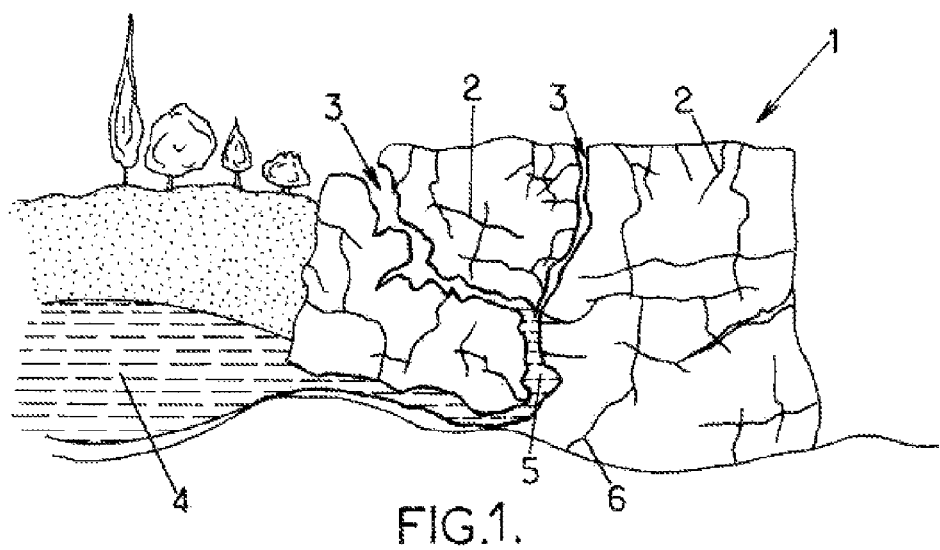
FIG. 1 shows an exemplary karstic region.

FIG. 1 shows an exemplary karstic region 1. This region 1 comprises fractures 2, 6, and cavities 3, 5 in a rock. Since the region 1 is partly flooded, for example because of the proximity of a water table 4, the fractures 6 and the cavities 5 may be filled with water.

The rock may for example comprise limestone.

Rainwater, or even water from the water table or from hydrothermal lifts, can infiltrate through the interstices, for example the pores of the rock, the fractures 2, 6, and/or the cavities 3, 5. This infiltration increases the size of these interstices by virtue of the dissolution of carbonates of the rock in the infiltrated water, which can lead to the formation of cavities.

Figure 2:
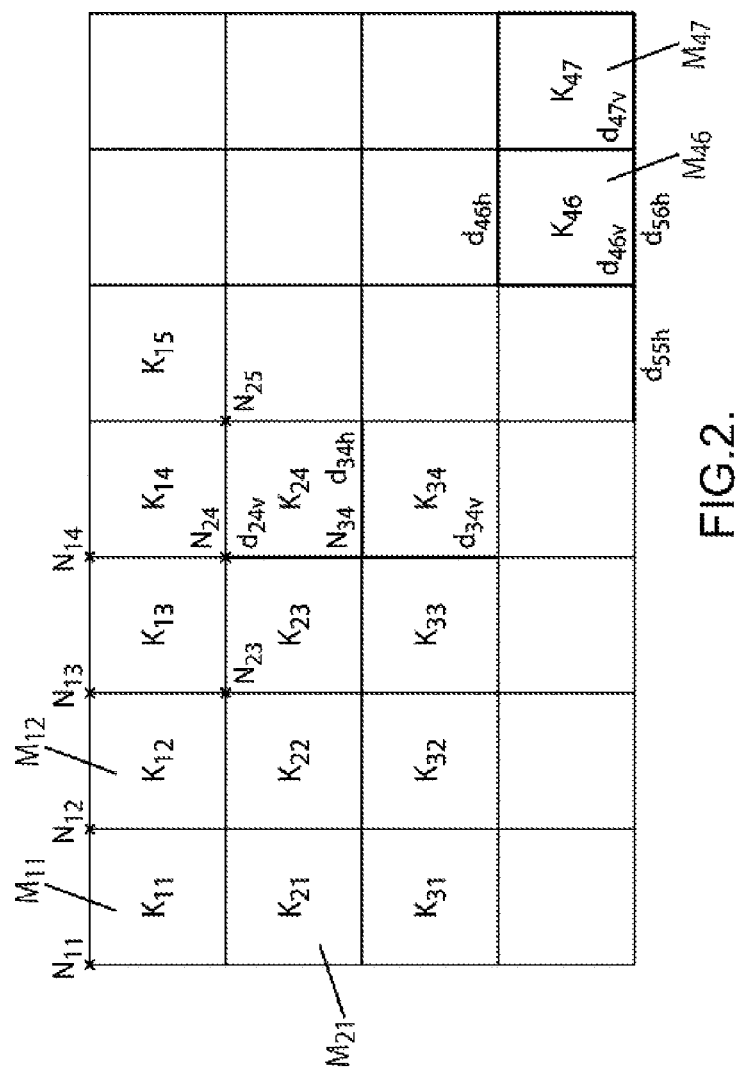
FIG. 2 schematically represents an exemplary gridded geological model according to an embodiment of the invention.

FIG. 2 schematically shows an exemplary gridded geological model according to an embodiment of the invention. This model can be used to simulate karstification phenomena, according to a "gas-over-network" approach. The stochastic displacement of particles over the network is simulated. The particles represent the water infiltrated into the rock. Each particle can, for example, correspond to a drop of water, to a water molecule, or similar.

The gridded geological model can be two-dimensional, as in the example illustrated by FIG. 2 for more clarity, or, advantageously, three-dimensional.

This model comprises grids $M_{11}$, $M_{12}$, $M_{21}$, ..., $M_{46}$, ....

In this embodiment, provision is made to assign by default to each grid $M_{ij}$ a geological grid parameter value, here a permeability value $K_{ij}$. The variables i and j are used to index the positions of the grids.

Thus, each grid $M_{11}$, $M_{12}$ ... has a corresponding permeability value $K_{11}$, $K_{12}$, .... These permeability values are used to describe a first environment.

The probability of the stochastic displacement of a particle in the first environment is calculated by taking into account these permeability values, so as to simulate a flow in a porous rock, also called matrix.

A second environment is described by edge parameter values, for example diameters of pipes $d_{24v}$ ... between two nodes $N_{24}$, $N_{34}$, ....

The probability of the stochastic displacement of a particle in the second environment is calculated by taking into account these pipe diameter values $d_{24v}$..., so as to simulate a flow of water through the fractures.

An example of simulation of the stochastic displacements over the network is described hereinbelow.

The particles can be introduced at a given node, for example $N_{11}$, or else at a number of nodes. The particles can be introduced with a given periodicity.

For the purposes of simplification, provision can be made for the particles not to interact with one another, that is to say for the displacement of a particle to be independent of the locations of the other particles.

In this embodiment, it is considered that the particles are subjected to two types of displacements: an advective or systematic displacement, and a dispersive displacement.

For a given grid, the advective displacement is likely to take place along a line and in a direction given by a hydraulic gradient corresponding to the region modeled, to the fact that this region is saturated or not, or some other factor. For example, for the grids represented in FIG. 2, the advective displacement is likely to take place along the line and in the direction of the gravity vector. For a saturated cavity, the advective displacement is likely to take place along the line and in the direction of the flow. For grids corresponding to a region of hydrothermal lifts, the advective displacement can have a component contrary to the force of gravity.

To this possible advective displacement is added the dispersive displacement, which is likely to take place along a plurality of lines.

During the simulation of the displacement of a particle situated on a grid, a probability of advective displacement is estimated. A random draw weighted by this estimated probability is then performed, and the advective displacement takes place or not according to the result of the random draw.

This probability is estimated as a function of an equivalent permeability parameter $K_{eq}$.

For a displacement between two nodes of the first environment, provision can be made to calculate an equivalent permeability $K_{eq}$ from the permeability values of the grids comprising these two nodes. For example, for a displacement from the node $N_{14}$ to the node $N_{24}$, an equivalent permeability is calculated from the values $K_{13}$, $K_{14}$. In the case of a three-dimensional network, the equivalent permeability would be calculated from four permeability values. There is thus a transition from a volume-oriented model to a grid model ("voxcet").

The equivalent permeability for a given displacement in the first environment can in particular be an average, for example an arithmetic or geometrical average, of the permeabilities of the grids comprising an edge corresponding to this displacement. For a displacement in the second environment, that is to say a displacement along a pipe, for example from the node $N_{24}$ to the node $N_{34}$, an equivalent permeability value $K_{eq}$ can be deduced, from the pipe diameter d corresponding to this displacement, according to, for example:

$$K_{eq} = 2\log\left(\frac{1.9}{r}\right)\sqrt{2gd},$$

r being the relative roughness, typically equal to 0.2, and g the gravitational acceleration.

The probability of advective displacement Prob_Adv, also called "velocity module", is estimated from the equivalent permeability values, according to:

Prob_Adv($K_{eq}$)=0 if $K_{eq}$ is less than $K_{min}$,
Prob_Adv($K_{eq}$)=1 if $K_{eq}$ is greater than $K_{max}$ greater than $K_{min}$
and $$\text{Prob\_Adv}(K_{eq}) = \frac{\log(K_{eq}) - \log(K_{min})}{\log(K_{max}) - \log(K_{min})}$$

in the other cases

Figure 3:
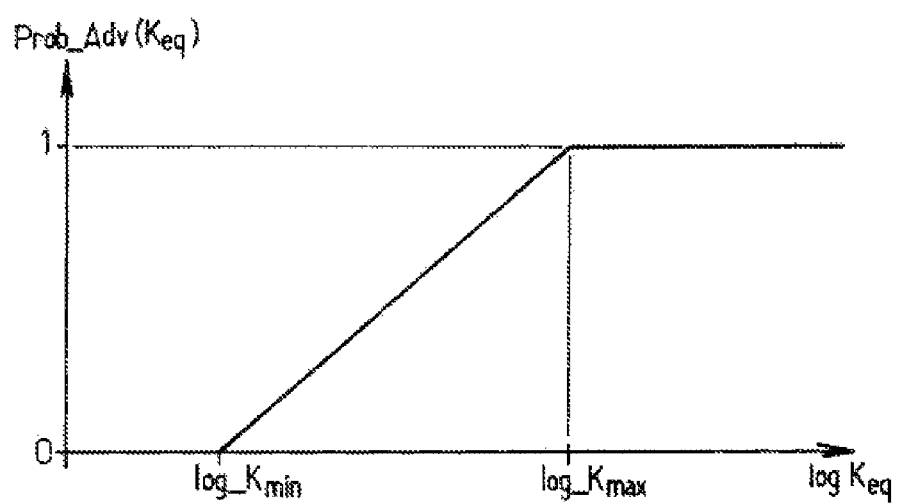
FIG. 3 is a graph of the probability of advective displacement of a particle as a function of the equivalent permeability, according to an embodiment of the invention.

FIG. 3 is a graph of the probability of advective displacement as a function of the equivalent permeability for the first environment.

The values $K_{max}$ and $K_{min}$ are different depending on whether the location is the first environment or the second environment, whether the environment is saturated with water or not, or some other factor.

In particular, it is possible to provide for the thresholds $K_{min}$ and $K_{max}$ for the first environment to be less close together than the thresholds $K_{min}$ and $K_{max}$ for the second environment. A graph of the probability Prob_Adv as a function of the logarithm of K for the second environment would thus appear the same as the graph of FIG. 3, apart from the fact that the slope would be steeper.

A random draw weighted by this probability Prob_Adv is then performed, and the advective displacement takes place or not depending on the result of the random draw.

To this possible advective displacement is added a dispersive displacement, likely to take place along a number of lines.

For example, to return to FIG. 2, by allowing an advective displacement between the nodes $N_{14}$ and $N_{24}$, there are three possibilities of dispersive displacement available to the particle: toward the node $N_{23}$, toward the node $N_{34}$ or toward the node $N_{25}$. The possibility of an advective displacement in the direction contrary to that of the hydraulic gradient is excluded.

For each of these possibilities toward a node $N_{ij}$, a probability Prob_Disp_ij, is estimated, according to:

$$\text{Prob\_Disp\_ij}(K_{eq}^{i,j}) = \frac{\log(K_{eq}^{i,j})}{\sum_{i,j} \log(K_{eq}^{i,j})}$$

in which $K_{eq}^{i,j}$ designates the equivalent permeability for the displacement from the node $N_{24}$ to the node $N_{ij}$, estimated in the first environment from the permeability values of the grids that have an edge corresponding to this displacement, and in the second environment from the diameter of the pipe corresponding to this displacement,
and in which the sum $$\sum_{i,j} \log(K_{eq}^{i,j})$$

is performed over the various possibilities of dispersive displacement. To go back to the example of FIG. 2, this sum comprises three terms. In a three-dimensional network, this sum would comprise five terms.

In the case in point, the values $K_{eq}^{2,3}$ and $K_{eq}^{2,5}$ would be calculated from the values $K_{13}$, $K_{23}$, and $K_{14}$, $K_{24}$, respectively, whereas the value $K_{eq}^{3,4}$ corresponding to a displacement along a pipe would be calculated from the value $d_{24\nu}$.

A random draw weighted by these probabilities Prob_Disp_ij is then performed, and the dispersive displacement takes place along the line and in the direction given by the result of the random draw. Given the usual permeability and pipe diameter values, the displacement has relatively high chances of being performed in the second environment (fracture), that is to say from the node $N_{24}$ to the node $N_{34}$.

Thus, for each particle, an advective displacement (possibly nul) and a dispersive displacement are calculated, and this is done repeatedly over a relatively high number of cycles.

A particle is thus capable of passing from the matrix to the fracture. In the reverse direction, it will be noted that, given the usual permeability and pipe diameter values, a particle has relatively little chance of passing from a discontinuity to the matrix. These stochastic displacement calculations are performed for each particle, and repeated cyclically.

For example, on each cycle (or "time step"), $10^9$ particles are introduced onto the network. The number of cycles can be of the order of a million. The number of grids of the network can, for example, be of the order of a hundred thousand or a million.

The values of the descriptions of the first and of the second environments are modified according to the courses taken by the particles.

In particular, provision can be made for assigning each grid a value of a karstification index IK indicative of the dissolution potential of the rock. This index can be of similar or equal values for the grids of a given region.

Also, it is possible to provide for assigning each particle a value of a particle aggressivity index IA. Typically, this index has one and the same value for all the particles, but it is also possible to provide different values, for example to take account of a period of an acid rainfall.

Thus, the passage of a particle between two nodes of the first environment modifies the permeability values of the grids that have an edge corresponding to this node.

The passage of a particle in a pipe of the second environment increases the diameter of this pipe, possibly within the limit of a maximum diameter. For example, this maximum diameter can be equal to the size of a grid side. A cavity with a size greater than the size of a grid can thus be modeled by pipes of a diameter equal to the maximum diameter. For example, the grids $M_{46}$, $M_{47}$ of FIG. 2 can correspond to such a cavity.

In these two cases, the volume of material extracted by the passage of the particle is a function of the product IK×IA.

FIG. 4 illustrates an exemplary karstification simulation method, according to an embodiment of the invention.

A grid is defined in a step 400. The dimensions associated with each grid can be defined, for example 100×100×5 meters, and certain grid properties such as the facies of the rock corresponding to each grid, the porosity, the permeability, the karstification index IK, or other can also be defined.

It is possible to use observations received in a step 401. These observations may, for example, comprise core samples, or even imaging data supplying information on the actual karstic region, for example rough placements of geological layers, of fault lines, of fractures, of impermeable barriers, or other.

The dimensions corresponding to a grid can be varied, for example a few cubic millimeters for laboratory applications or even a few thousand cubic kilometers.

An undersampling (or "resealing") is performed in a step 402, to reduce the number of grids, for example by a factor $5^3=125$ or $10^3=1000$, so as to limit the simulation time.

In a step 403, discontinuities of fracture type are introduced, randomly, by using, for example, a Boolean fracturing engine. Such an engine can be capable of taking into account the faces of the rock, and of generating a number of fracture families, these families being characterized for example by fracture densities, fracture geometries, fracture orientations, or other.

In a step 404, discontinuities of bedding or stratification joint type are introduced. It is possible to use observations received in the step 401.

Steps that are not represented of introducing other discontinuities can if appropriate be provided.

An initial pipe diameter is assigned to the edges of the grid corresponding to these discontinuities, in a step that is not represented.

In a step 405, different karstification phases are defined. For example, a phase may correspond to a period during which the rock has remained emerged with a certain hydraulic gradient, then another phase, later than another period, characterized by another hydraulic gradient, etc. Each phase has a corresponding set of discontinuities, out of the discontinuities already defined, in particular in the steps 403 and 404.

For example, discontinuities of north-south orientation and discontinuities of east-west orientation may have been defined in the step 403. Half of the discontinuities of north-south orientation and none of the discontinuities of east-west orientation may correspond to a first phase, whereas all of the discontinuities correspond to the second phase.

For each phase, it is possible to define a particle aggressivity index IA, a hydraulic gradient, a level of region saturated with water, the regions of infiltration and the saturated regions, an orientation of the rock, a velocity vector, a number of cycles assigned to this phase, the values $K_{min}$ and $K_{max}$ for each environment, a number of particles introduced in each cycle, particle introduction nodes, or other.

On each duly defined cycle, and for each particle, a simulation of stochastic displacements (step 408) is performed. In particular, the probabilities Prob_Adv and Prob_Disp are calculated (step 406) and a random draw weighted by these probabilities is performed (step 407). The simulated displacement of the particle is a function of the results of the random draw.

On each cycle, the description is modified in a step 409, according to the displacements simulated in the step 408.

The steps 406, 407 and 411 are performed for each particle and for each cycle. It is possible in particular to provide loops to cover the particles and the cycles.

The step 409 is performed on each cycle. Provision can be made to perform this step 409 after each stochastic displacement calculation for a particle, or, alternatively, to calculate the stochastic displacements for all of the particles before performing this step 409.

Test steps, represented by the test 411, provide an exit from the loop. These test steps may consist in checking that all of the cycles defined in the step 405 have been performed, and that, for each cycle, a displacement has been simulated for each of the particles.

Finally, in an oversampling or upscaling step 410, a model with a grid of the same type as that defined in the step 400 is estimated, from the description obtained at the loop output.

It is possible for example to use a pressure solver to estimate parameter values, for example of permeability, on regions that include discontinuities and matrix.

Figure 5:
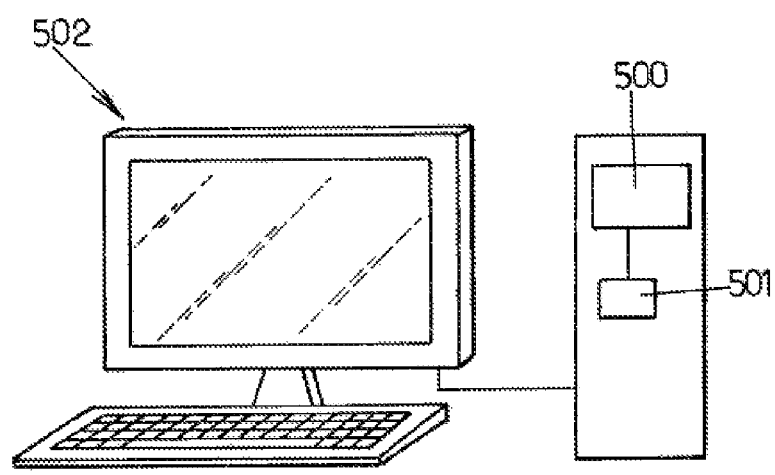
FIG. 5 shows an exemplary device for simulating karstification phenomena, according to an embodiment of the invention.

FIG. 5 shows an exemplary simulation device 502. In this embodiment, the device comprises a computer 502, comprising a memory 500 for storing the gridded geological model, and processing means, for example a processor 501, for performing the simulations and modifying the model.

The embodiments above are intended to be illustrative and not limiting. Additional embodiments may be within the claims. Although the present invention has been described with reference to particular embodiments, workers skilled in the art will recognize that changes may be made in form and detail without departing from the spirit and scope of the invention.

Various modifications to the invention may be apparent to one of skill in the art upon reading this disclosure. For example, persons of ordinary skill in the relevant art will recognize that the various features described for the different embodiments of the invention can be suitably combined, un-combined, and re-combined with other features, alone, or in different combinations, within the spirit of the invention. Likewise, the various features described above should all be regarded as example embodiments, rather than limitations to the scope or spirit of the invention. Therefore, the above is not contemplated to limit the scope of the present invention.

The invention claimed is:

1. A method for simulating karstification phenomena in a karstic region, comprising:
   a) defining a gridded geological model of the karstic region, said model having cells, in each cell of the gridded geological model:
      a first environment described by values of at least one geological grid parameter is defined, a displacement of particles may be simulated in said first environment, and
      a second environment described by values of edge parameters is defined, between two nodes of said cell, a displacement of particles may be simulated in said second environment,
   b) simulating stochastic displacements of particles in the grid of the geological model, the probability of each displacement of a particle being calculated by taking into account values describing the environment in which the displacement is carried out, and
   c) modifying said values describing the first and/or the second environment according to the courses taken by the particles;
      and wherein the edge parameter comprises a pipe diameter,
      in the step b) for at least one displacement in the second environment, an equivalent parameter is estimated from the pipe diameter value corresponding to said displacement,
      and where in the probability of said displacement is calculated as a function of said estimated equivalent parameter value.

2. The simulation method as claimed in claim 1, wherein in step b), a pre-established hydraulic gradient that is a function of the region in which the displacement is carried out is also taken into account.

3. The simulation method as claimed in claim 1, wherein in step b), for at least one displacement in the first environment, an equivalent parameter value is estimated from the values of a geological grid parameter of the grids comprising an edge corresponding to said displacement,
   and in which the probability of said displacement is calculated as a function of said estimated equivalent parameter value.

4. The simulation method as claimed in claim 1, comprising
   taking into account, in step b), the values of only one environment out of the first environment and the second environment.

5. The simulation method as claimed in claim 1, wherein the simulated displacements are advective and/or dispersive.

6. The simulation method as claimed in claim 1, wherein step c) involves a value of a karstification index indicative of the dissolution potential of the rock, and a value of an aggressivity index of the particles.

7. The simulation method as claimed in claim 1, wherein said at least one geological grid parameter comprises a grid permeability.

8. The simulation method as claimed in claim 1, wherein said at least one geological grid parameter comprises a grid porosity.

9. A non-transitory computer readable storage medium for simulating karstification phenomena in a karstic region, having stored thereon a computer program comprising program instructions, the computer program being loadable into a data-processing unit and adapted to cause the data-processing unit to carry out, when the computer program is run by the data-processing device:
   a) defining a gridded geological model of the karstic region, said model having cells, in each cell of the gridded geological model:
      a first environment described by values of at least one geological grid parameter is defined, a displacement of particles may be simulated in said first environment, and
      a second environment described by values of edge parameters is defined between two nodes of said cell, a displacement of particles may be simulated in said second environment,
   b) simulating stochastic displacements of particles in the grid of the geological model, the probability of each displacement of a particle being calculated by taking into account values describing the environment in which the displacement is carried out, and
   c) modifying the values describing the first and/or the second environment, according to the courses taken by the particles;
      and wherein the edge parameter comprises a pipe diameter,
      in the step b/, for at least one displacement in the second environment, an equivalent parameter is estimated from the pipe diameter value corresponding to said displacement,
      and wherein the probability of said displacement is calculated as a function of said estimated equivalent parameter value.

10. A device for simulating karstification phenomena in a karstic region, said device comprising
    a memory for storing a gridded geological model of the karstic region, said model having cells, in each fell of the gridded geological model, the model comprising a description:
    of a first environment described by values of at least one geological grid parameter, a displacement of particles may be simulated in said first environment, and
    of a second environment described by values of edge parameters between two nodes of said cell, a displacement of particles may be simulated in said second environment,
    processing means arranged for:
    simulating stochastic displacements of particles in the grid of the geological model, the probability of each displacement of a particle being calculated by taking into account the description of the environment in which the displacement is carried out, and
    modifying one and/or the other of the descriptions according to the courses taken by the particles,
    wherein the edge parameter comprises a pipe diameter, wherein the simulating comprises, for at least one displacement in the second environment, an estimation of an equivalent parameter from the pipe diameter value corresponding to said displacement, and wherein the probability of said displacement is calculated as a function of said estimated equivalent parameter value.

\* \* \* \* \*